US009514925B1

(12) United States Patent
Tam et al.

(10) Patent No.: US 9,514,925 B1
(45) Date of Patent: Dec. 6, 2016

(54) PROTECTIVE COATING FOR SILICON SUBSTRATE

(71) Applicant: Amazon Technologies, Inc., Reno, NV (US)

(72) Inventors: Samuel Waising Tam, Daly City, CA (US); Tak Shing Pang, Tsuen Wan NT (HK)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/850,658

(22) Filed: Sep. 10, 2015

(51) Int. Cl.
| | |
|---|---|
| *H01L 21/02* | (2006.01) |
| *H01L 21/56* | (2006.01) |
| *H01L 21/32* | (2006.01) |
| *H01L 21/324* | (2006.01) |
| *H01L 21/78* | (2006.01) |
| *H01L 23/544* | (2006.01) |
| *H01L 21/683* | (2006.01) |

(52) U.S. Cl.
CPC ... *H01L 21/02019* (2013.01); *H01L 21/02016* (2013.01); *H01L 21/02021* (2013.01); *H01L 21/324* (2013.01); *H01L 21/561* (2013.01); *H01L 21/6835* (2013.01); *H01L 21/6836* (2013.01); *H01L 21/78* (2013.01); *H01L 23/544* (2013.01); *H01L 2221/68327* (2013.01); *H01L 2223/54426* (2013.01); *H01L 2223/54453* (2013.01)

(58) Field of Classification Search
CPC ............... H01L 21/50–21/62; H01L 2224/94; H01L 24/02; H01L 24/95
See application file for complete search history.

(56) References Cited

U.S. PATENT DOCUMENTS

| | | | | |
|---|---|---|---|---|
| 8,692,357 B2* | 4/2014 | Ning | ....................... | H01L 21/78 257/620 |
| 2008/0213976 A1* | 9/2008 | Farnworth | ............ | H01L 21/561 438/460 |
| 2015/0357242 A1* | 12/2015 | Nakamura | .............. | H01L 21/78 438/462 |

* cited by examiner

*Primary Examiner* — Karen Kusumakar
(74) *Attorney, Agent, or Firm* — Hogan Lovells US LLP

(57) ABSTRACT

Various approaches discussed herein enable techniques for protecting die units made of silicon substrate. A substrate, or wafer, is provided that has multiple die units built onto it, as well as saw streets between the die units. The substrate is cut into along the saw streets at a first width, after which a coating is applied to a side of the wafer so that the side of the wafer is covered with the coating as well as the channels created by the cutting being substantially filled with the coating. After curing the coating, a second cut is made along the saw streets and through the cured coating, so that the individual die units, once separated, have a protective layer of the coating attached to one side and the periphery of the die unit.

20 Claims, 10 Drawing Sheets

PROTECTIVE COATING FOR SILICON SUBSTRATE

BACKGROUND

As the popularity of mobile devices continues to increase, manufacturers seek ways to make thinner devices, while continuing to add more powerful processors, cameras, and other components. Mobile devices are subject to levels of physical stress and environmental conditions that are generally not found with regard to more traditional "desktop" computing devices that are not necessarily designed to be carried on or about a person. Silicon "wafers," also called "substrates," provide the semiconductor material used in the fabrication of many integrated circuits, and are generally thinner, but less durable, than the substrates currently used in the fabrication of integrated circuits used in mobile devices.

BRIEF DESCRIPTION OF THE DRAWINGS

Various embodiments in accordance with the present disclosure will be described with reference to the drawings, in which.

DETAILED DESCRIPTION

Systems and methods in accordance with various embodiments of the present disclosure may overcome one or more of the aforementioned and other deficiencies experienced in conventional approaches for wireless communication using the same frequency band. In particular, various embodiments enable a device, such as a wireless-enabled device, to receive and transmit data, for example to another wireless-enabled device, using one or more wireless technologies that operate on the same frequency band, for example Wi-Fi and Bluetooth.

Various approaches discussed herein enable cutting and coating a wafer comprising a plurality of die units so that the individual die units have a layer of protective coating on at least one side and on the periphery of the die. This is accomplished according to an embodiment by cutting through the wafer at a first width along the saw streets, applying the coating so that it substantially covers one side of the wafer and substantially fills the channels left by the cutting. Once the coating is cured, the wafer is cut again along the saw streets, although the second cut is at a narrower width than the first cut, and is through the cured coating between the die units instead of the substrate. After the units are singulated, they have the protective layer of coating thanks to the narrower width cut.

Accordingly, approaches in accordance with various embodiments improve the operation and performance of computing devices, such as those on which they are implemented by, among other advantages, making the silicon substrate more durable, thereby enabling thinner and lighter devices, which offers the manufacturers opportunity to provide more advanced technology in the device. Various other applications, processes, and uses are presented below with respect to the various embodiments, each of which improves the operation and performance of the computing device(s) on which they are implemented. While a silicon substrate is discussed herein, it should be understood that the disclosed techniques are applicable to any type of substrate or wafer, for example Quartz or Gallium Arsenide.

Figure 1:
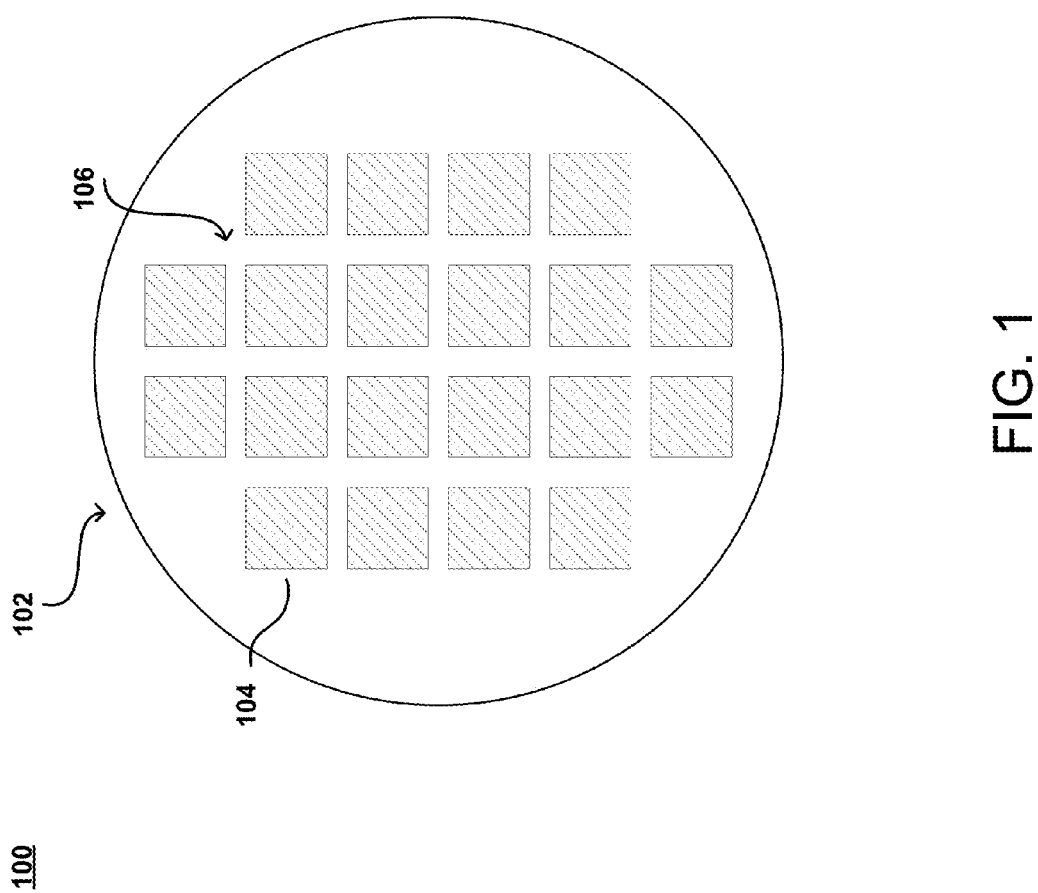
FIG. 1 illustrates a view of a top side of a silicon substrate on which a plurality of die units are disposed, in accordance with various embodiments.

FIG. 1 illustrates a view 100 of a top side of a silicon substrate 102 on which a plurality of die units 104 are disposed, in accordance with various embodiments. A silicon substrate, or "wafer," is generally a thin slice of semiconductor material, such as a crystalline silicon, used in electronics for the fabrication of integrated circuits. Silicon wafers offer an advantage over other materials that may be used as substrates, such as FR4, FR2, rigid flex, ceramic, and other substances. For example, FR4 is a composite material composed of woven fiberglass cloth with an epoxy resin binder. While non-silicon substrates may be more durable than silicon substrates, and therefore well-suited to mobile environments like cellphones, they generally cannot be manufactured as thin as a silicon substrate can be. Silicon substrates also offer advantages such as lower cost, better yield and rigidity, less particles, better thermal dissipation, better flatness, and improved accuracy and alignment when the circuits are routed on its surface. By using a silicon substrate as part of a complete camera module unit, for example, companies can save on assembly cost, re-work cost, and improve the overall yield.

Because the manufacturers of mobile devices continually try to make their devices thinner, a silicon substrate that is also durable enough to withstand the environmental and other stresses placed on mobile devices would be advantageous, allowing thinner devices than those where chipsets are based on non-silicon substrates. Current techniques for manufacturing silicon substrates may offer the characteristic of thinness, but do not produce components that are durable enough for use in mobile devices. For example, camera modules in cellphones use chipsets that are on non-silicon substrates (e.g., FR4) due in large part to their durability. Mobile devices (e.g., cellphones, cameras, etc.) usually are carried on a person and are subject to being dropped and jostled, in addition to being utilized in environments with dust and other particulate matter in the air, as well as extreme temperature ranges. The techniques described herein offer clear advantages over the current approaches for fabricating, cutting, and coating silicon substrates, although the techniques described herein are not necessarily limited to silicon substrates, and may be utilized with other substrate materials.

Wafers are usually circular in shape, with a top side and bottom side that are opposite to each other, and a periphery, which may be considered the outward-facing edge around the circumference. Wafers can come in various sizes, such as in a variety of diameters, for example from 25.4 mm (1 inch) to 450 mm (17.72 inches), and thicknesses that can be measured in micrometers to millimeters. The wafers serve as a base for integrated circuits built in and over the wafer. These integrated circuits are fabricated on the substrate in a layering process that can involve steps of imaging, deposition and etching the substrate using well-known techniques such as photolithography. Discrete, individual regions of these circuits on the substrate comprise dies, which may be thought of as a small block of substrate on which a given functional circuit is fabricated. Typically, integrated circuits are produced in large batches (e.g., hundreds) on a single wafer. The wafer is cut (i.e., diced) into many pieces, each containing one copy of the circuit. Each of these pieces is a die 104. The die created may be any shape generated by straight lines, but they are typically rectangular or square-shaped. After the manufacturing process forming the dies is finished, the individual dies are diced and packaged, which is where the substrate on which the die's circuits are etched is encased in a supporting case that prevents physical damage and corrosion. The case (i.e., "package") supports the electrical contacts that connect the device to a circuit board.

Many automated approaches exist for wafer dicing, such as scribing and breaking, cutting or sawing with a "dicing saw," laser cutting, and plasma-based die singulation. During the dicing process, a wafer is generally mounted or placed on or in a dicing frame, which may be a thin sheet metal frame, usually circular in shape (e.g., a ring). Dicing tape may be used, for example to hold the wafer to the dicing frame as well as holding the individual die units together after dicing. Dicing tape has one or more sticky sides and is applied/attached to the top and/or bottom side of the wafer, usually before dicing, and may also be applied to the dicing frame. Some dicing tape may be UV-curable, wherein the adhesive bond of the tape can be broken by exposure to UV light after dicing, allowing the adhesive to be stronger during cutting while still allowing clean and easy extraction of the individual dies for packaging or direct placement on a printed circuit board substrate (e.g., a bare die).

Between the dies 104 on the wafer 102, a thin non-functional spacing is provided where wafer dicing may be performed without damaging the circuits. This spacing between the dies, generally running vertically and horizontally along the wafer, is called a saw street 106, although the saw street may still be referred to as such after the cutting takes place (e.g., the now-created space between the die units may still be referred to as the "saw street"). The width of the street can be very small (e.g., 75 μm). In the example of mechanical sawing, a saw blade forms channels through the wafer by, for example, cutting along the saw streets 106, which results in reducing the wafer containing multiple identical integrated circuits to individual dies, each die containing one of those circuits.

Figure 2A:
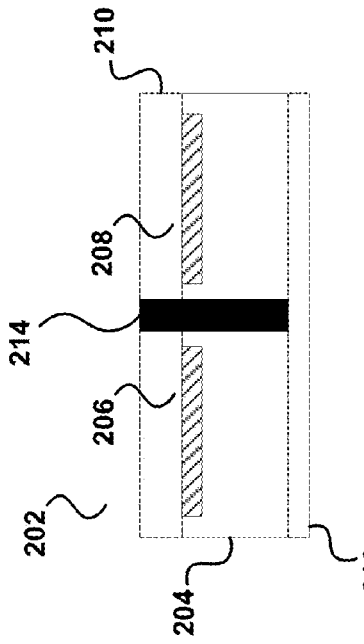
FIGS. 2A-2D illustrate an example approach for a substrate cutting and coating technique, in accordance with various embodiments.

FIGS. 2A-2D illustrate an example approach for a substrate cutting and coating technique, in accordance with various embodiments. In FIG. 2A, a sample portion 202 of a silicon substrate (wafer) 204 is displayed. It should be understood that the example in FIGS. 2A-2D is merely a portion of a complete wafer for illustrative purposes only, and that the techniques described herein are applicable to the entire wafer. The wafer 204 is mounted, for example on a dicing plate (not shown). The wafer 204 has a top side and a bottom side, and either side may be mounted onto the dicing plate; however, according to an embodiment illustrated in FIGS. 2A-2D, the bottom side is first mounted to the dicing plate. On the top side, individual die units 206, 208 have been manufactured, as described earlier with regard to techniques such as photolithography. A saw street 212 exists between the die units 206, 208, along which the wafer is to be cut, as described further herein. In some embodiments, one or more of the saw streets may be pre-etched or pre-scored. In some embodiments, a protective and/or adhesive tape, such as dicing tape (e.g., UV curable) 210 may be attached to the bottom and/or top of the wafer, and in some embodiments applied to the dicing plate in addition to (or instead of) on the wafer. In some embodiments, the dicing tape 210 attaches the wafer 204 to the dicing plate, for example to secure it during cutting so that no movement takes place that could interfere with the accuracy of the cutting. In some embodiments, different types of tape or covering 210 may be utilized, for example to secure the bottom of the wafer 204 to the dicing plate and to protect the top part of the wafer 204 and its dies 206, 208.

Figure 2B:
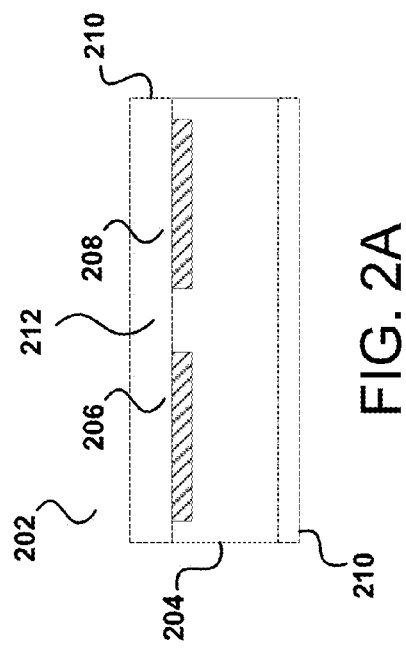

In FIG. 2B, a channel 214 has been formed through the wafer along the saw street 212 between the die units 206, 208. According to an embodiment, this channel is formed by cutting with a cutting tool having a particular width and vertically into the wafer 204. In various embodiments, the wafer 204 may be cut all the way through, or partially. The cutting may be performed by any technique known in the art, such as by saw cutting, laser cutting, etc. The most common technique is dicing with a diamond blade, which offers high cut quality and fine controls on cut width, depth, and straightness. A diamond blade as used in an embodiment looks like a circular saw blade and cuts into the top and/or bottom surface of the wafer 204, and through the protective and/or dicing tape 210, although in various embodiments the dicing tape 210 attaching the wafer 204 to the dicing plate may only be cut partially through, not cut at all, or completely cut through. The diamond blade used in an embodiment may be smooth or serrated, and comprise a ring of abrasive material such as diamond particles, which may function as "teeth." Each diamond particle acts as a single-cutting tool and as it cuts, it pushes an amount of cut-out material ahead of it, creating what is called a kerf. Because of the tremendous heat generated by the friction of the sawing, water or other substances may be used to cool the equipment and clean silicon debris out of the kerf.

According to other embodiments, laser cutting may be utilized to cut the channels 214 into the wafer 204, and may be used in place of, or along with, traditional physical sawing equipment and techniques. Example laser dicing techniques include stealth dicing, a two-stage process in which defect regions are firstly introduced into the wafer by scanning the beam along intended cutting lines and then expanding an underlying carrier membrane to induce fracture. Other techniques may be used, such as a "dice before grind" approach wherein a wafer is initially diced using a half-cut dicer to a depth below a final target thickness, and then a side of the wafer 204 is ground down in order to thin it to the target thickness. Additional dicing techniques such as plasma dicing also may be utilized as part of the techniques described herein.

Figure 2C:
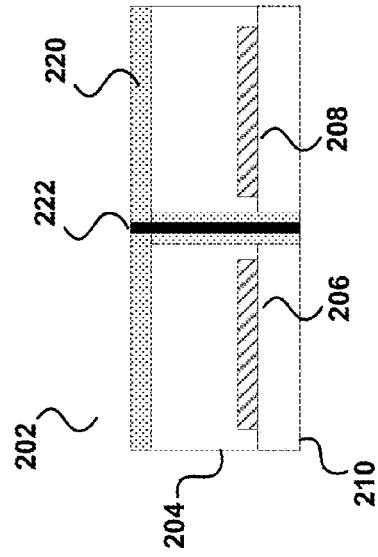

In FIG. 2C, the wafer 204 has been flipped over, such that in an embodiment the top side with the die units 206, 208 that was cut in the previous step is now face-down, for example in the same or a different dicing frame. In some embodiments, the wafer 204 is not flipped over, but the dicing machinery is maneuvered to operate on the opposite side from where the first channels were cut (as in FIG. 2B). In some embodiments as discussed further herein, turning over the wafer may be thought of as the die units being singulated and turned over such that they (i.e., the portions of the wafer of which the die units are a part) are placed in an arrangement, face-down (i.e., the "active" side with the circuitry, paths, etchings, etc.) onto some type of support, such as a carrier plate or dummy wafer, which may have dicing tape attached to it. In some embodiments, dicing tape 210 (or other covering) is applied to the side of the wafer that was cut in the previous step, either before flipping the wafer 204 or after, for example as part of mounting the previously-cut side of the wafer 204 onto a dicing frame. The dicing tape 210 may also be applied to the dicing plate onto which the wafer is to be flipped, in addition to or instead of the wafer 204. In an embodiment, the first channel went through the wafer 204, but only partially through the dicing tape 210 (or not through it at all in some embodiments), which allows the wafer 204 to be flipped over without the die units coming apart.

According to an embodiment, a coating 220 (e.g., a layer of die attach adhesive epoxy, etc.) is applied to the opposite side of the wafer having the die units 206, 208; for example, the "bottom" side, although coating the side of the wafer 204 with the die units 206, 208 is contemplated in other embodiments. In various embodiments, as discussed above, the die units have been singulated and are placed on a carrier plate, such that the coating is applied to a bottom side of the wafer 204, in such that a die unit is formed on the wafer, and turning over the die unit means turning over the portion of the wafer of which the die unit is a part. The "top" side of the wafer 204 may be thought of as the "active" side of each of the singulated die units (e.g., having etchings/tracings, circuitry disposed thereon), while the "bottom" side of the wafer is the "passive" side of the die unit in this and other embodiments. In various embodiments, a dicing tape 210 or other covering that may have been attached or applied to the bottom side in a previous step is removed prior to coating the bottom side of the wafer 204, for example by irradiating the dicing tape with UV light, or other method, although in some embodiments the covering 210 is left on until a later step. The coating 220 is applied so that it covers the bottom side of the wafer 204 and also fills up the channel 214 (i.e., the saw streets after cutting) between the die units 206, 208 cut in the previous step.

According to various embodiments, one or more techniques may be utilized to apply the coating, such as spin coating, stencil printing, and/or transfer molding. Spin coating is a technique used to uniformly deposit a thin film of coating to flat surfaces, such as a wafer 204. According to one approach, coating material is applied to the wafer surface, usually in the center, and then the wafer is rotated at high speed in order to spread the coating material using centrifugal force. The wafer continues to rotate while the coating spins off the edges of the circular wafer. The higher the speed of spinning, the thinner the coating, although other factors such as the properties of the coating material affect the thickness of the application. Using this technique, the bottom side of the wafer 204 may be coated and the channels 214 cut as part of the previous step may be filled with the coating 220. In various embodiments, the channels are entirely filled, or may be partially filled, or a subset of the channels cut into the entire wafer may be filled.

Examples of stencil printing (also known as "screen printing") involve placing a deposit of coating 212 (e.g., a die attach epoxy adhesive such as Ablebond LM8895, etc.) on the side of the wafer 204 desired to be coated, and then using a combination of a stencil with a particular thickness (e.g., 0.2 mm), squeegee, and pressure, the coating 212 is applied uniformly along the wafer and into the channels 214 cut as part of the previous step.

Another technique for applying the coating according to various embodiments is transfer molding or compression molding. In an example of transfer molding, a pellet of coating material and the substrate are placed in a mold tool and preheated. The substrate may be equipped with electronic components, a pressure sensitive film, or other items. A plunger presses on the pellet, causing the pellet to melt, and the melted coating is pressed into the cavity. The coating fills the cavity, and covers the bottom side of the wafer and fills the channels caused by the cutting, for example due to pressurization of the molding/coating material. After filling the cavity the coating material may be pre-cured and the plunger is removed.

Figure 2D:
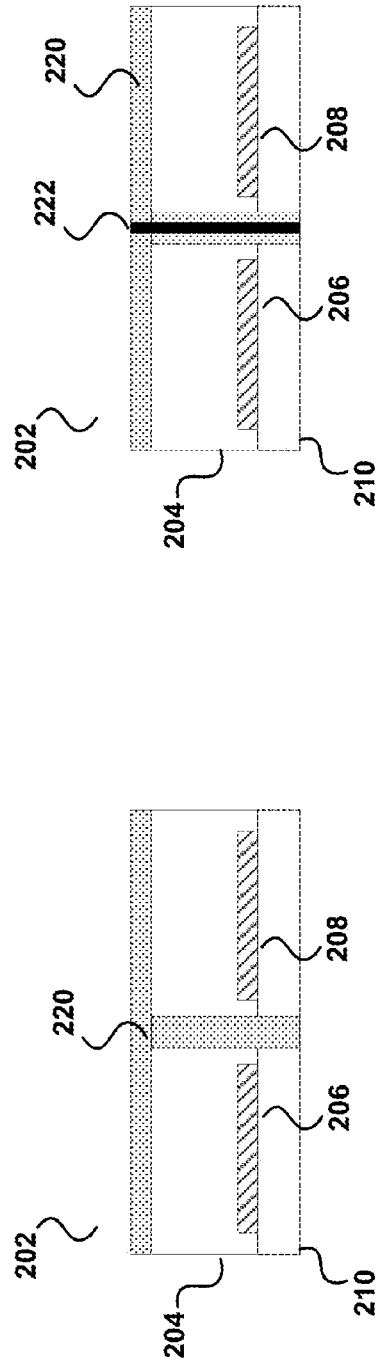

In FIG. 2D, after flipping the wafer and applying the coating 220 such that it has filled the channels cut in a previous step (e.g., the channels cut into the top side of the wafer) and in an embodiment been "set" or "cured," a second channel 222 is cut vertically into the bottom side of the wafer (i.e., the side without the integrated circuits), although in various embodiments, the second cutting may be performed on the same side as the first cutting (i.e., the "top" side with the integrated circuits), for example by flipping the wafer back over such that the "bottom" side is back in contact with the dicing plate. Additional dicing tape applications may be utilized to secure the wafer after this flip. According to various embodiments, the wafer may not be "flipped" at all, and the cutting tools are maneuvered into place on the wafer side to be cut into. According to an embodiment, the coated wafer may have notches, markings, pre-scoring, or other indicators on its face and/or periphery that allow for precise cutting of the second channel along the saw streets, even though the saw streets may not be visible due to the coating and/or the wafer being flipped over (i.e., on its "top" side).

This second cutting results in channels having a width narrower than the first channel; for example, a narrower saw blade may be used for the second cutting, or a laser with a narrower width beam, etc., although any approach that results in a narrower cut/channel may be utilized. In an embodiment, these new channels are cut along the same saw streets as the first channels, and the result of cutting these channels with a narrower tool and/or at a narrower width is that a layer of the coating 220 at some thickness is left on the bottom side and the periphery (i.e., the side along the circumference facing outward) of the individual die units after the second cutting and once they are separated (i.e., singulated) from each other, for example by irradiating any UV curable tape holding the individual die units together.

The layer of coating left on the die units as a result of the above techniques acts as a protective layer encapsulating the bottom (i.e., "back") side and periphery of the die unit, making the silicon substrate better able to withstand the type of handling discussed earlier with regard to mobile devices and the like. Instead of a non-protected, fragile silicon substrate, this protected substrate has improved durability, which minimizes cracking, chipping, and other damage, which may be suffered during a drop test or other occasion if the substrate were not protected using the techniques described herein.

Figure 3:
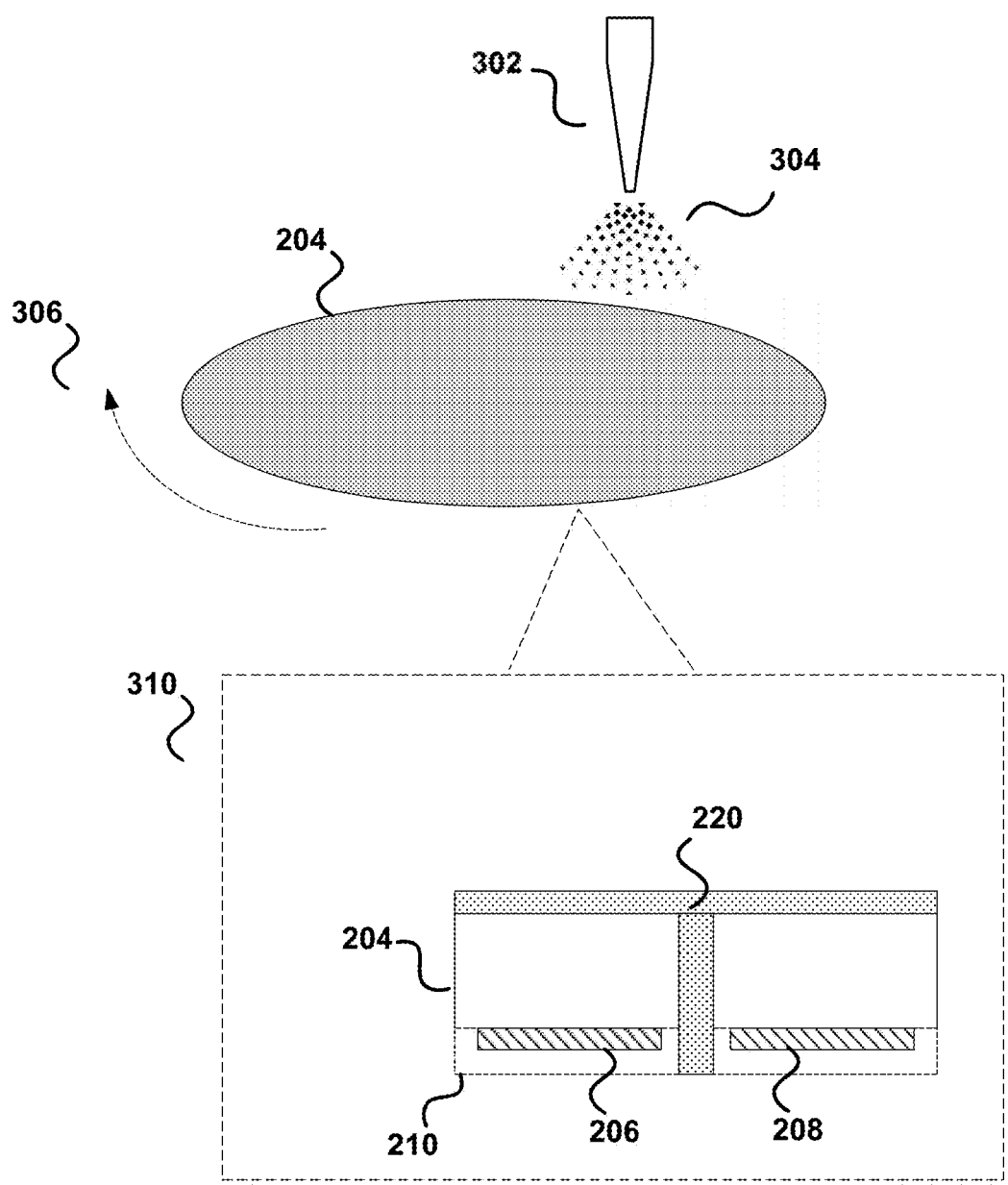
FIG. 3 illustrates an example approach for a substrate coating technique, in accordance with various embodiments.

FIG. 3 illustrates an example approach 300 for a substrate coating technique, in accordance with various embodiments. In the example of FIG. 3, a spin coating technique is illustrated, although as mentioned earlier, other coating techniques are envisioned, such as stencil printing and transfer molding. In the example of FIG. 3, a nozzle 302 or similar dispensing device is provided that applies a coating 304 to a bottom side of a silicon substrate 204 (i.e., wafer) having a plurality of individual die units disposed on the top side, for example on the opposite side than that being spin coated. A spin coating of epoxy on the top side with the die units would cover the circuitry paths that had previously been built.

While a non-centered spray 304 of coating material is illustrated in FIG. 3, in various embodiments, different types of application procedures for spin coating are envisioned. For example, the nozzle 302 may dispense a small amount of coating 304 substantially to the center of the wafer 204, and the wafer is then rotated 306, for example by a spindle attached to a mounting plate (not shown) on which the wafer rests (e.g., is attached to, perhaps by means of dicing/mounting tape). As the wafer 204 rotates, the coating 304 is distributed over the surface of the wafer (e.g., the "bottom" side without the integrated circuitry comprising the individual dies) and into the channels (i.e., saw streets) made by the first cutting, as described earlier.

The cutaway 310 in FIG. 3 illustrates this coating, as discussed and illustrated earlier with respect to FIGS. 2A-2D. It should be understood that reference numbers are carried over between figures for similar components for purposes of explanation, but that such use should not be interpreted as a limitation on the various embodiments. The "bottom side" of the wafer 204 is the side on which the coating 220 is applied, while the "top side" has the circuitry of the individual die units 206, 208. In various embodiments, dicing tape and/or other coverings 210 may be applied to either the top or bottom side, at any point in the processes described herein. While FIG. 3 illustrates an example embodiment utilizing spin coating, as described herein, other types of coating application techniques known in the art may be utilized, individually or in concert.

Figure 4C:
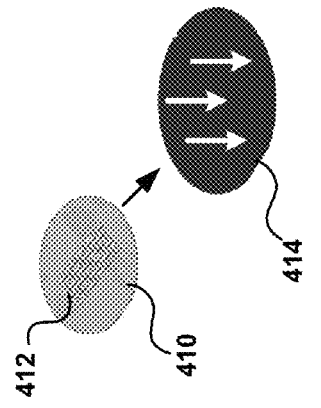
FIGS. 4A-4F illustrate an example approach for a substrate cutting and coating technique, in accordance with various embodiments.
Figure 4B:
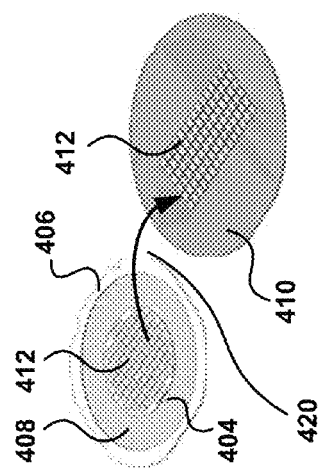
Figure 4A:
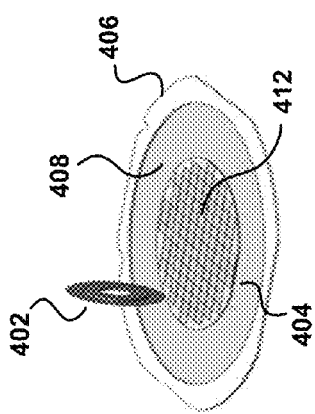

FIGS. 4A-4F illustrate an example approach for a substrate cutting and coating technique, in accordance with various embodiments. In FIG. 4A, a wafer 404 comprising individual die units 412, as discussed herein, is placed onto a support 406, such as a dicing plate or mount, and held in place on plate 406, for example by adhesive dicing tape 408 or other approach. While adhesive dicing tape 408 in FIGS. 4A-4F is illustrated as occupying a surface area larger than wafer 404, in various embodiments, dicing tape 408 may be the same size and shape as wafer 412 or in any other size, shape, or configuration, such as applied to plate 408 and/or wafer 404. A cutting implement 402 (e.g., a saw) having a particular width (i.e., capable of cutting channels of a certain width through wafer 404) cuts through wafer 404 along the saw streets between die units 412, as discussed herein.

In FIG. 4B, once die units 412 have been singulated or otherwise separated, for example by cutting implement 402, each die unit 412 is placed 420 onto a carrier plate (e.g., "carrier plate") 410 which may be thought of as any type of supporting layer onto which the die units 412 may be moved. The die unit may be thought of as having a portion of the substrate attached to it, as the die unit was formed on the wafer. According to an embodiment, the die units 412 are flipped over (if necessary, depending on the orientation of wafer 404 during dicing) after extraction from wafer 404 and any adhesive dicing tape 408, and placed 220 face-down onto carrier plate 410 (i.e., the "active surface" is face-down on the carrier plate with the "passive side," or side without etching, tracing, integrated circuitry, etc., face-up). In an embodiment, the carrier plate 410 has double-sided adhesive dicing tape applied to its surface, so that the die units 412 are affixed to the surface once moved 420. According to an embodiment, the die units 412 are placed 420 onto carrier plate 410 such that the spacing between them (i.e., channels corresponding to "new" saw streets) is closer (i.e., narrower width) than the spacing when die units 412 were part of wafer 404, and in some embodiments, the new placement is comprised of a different overall shape and/or arrangement, in some embodiments the new placement (i.e., arrangement) having a smaller area than the area of the original arrangement of die units on the wafer. For example, instead of die units 412 being arranged in a circular area (as illustrated with regard to FIG. 1, for example), the reconstituted die units 412 may be placed 420 onto carrier plate 410 in a rectangular shape, a square shape, or any other desired arrangement. In various embodiments, there may be non-uniform spacing between the die units 412. In effect, the wafer 404 previously constituted of individual die units 412 may, in various embodiments, be re-constructed by moving die units 412 to a new surface in a new arrangement and face-down instead of face-up.

In FIG. 4C, carrier plate 410 and face-down die units 412 are coated, for example with a layer of epoxy or otherwise appropriate coating material. According to various embodiments, various techniques may be utilized to perform the coating; for example, in the example of FIG. 4C, a compression molding (i.e., transfer mold) techniques is used. According to an embodiment, as a result of the die units 412 being face down and having channels (e.g., space) corresponding to the "new" saw streets between them, a layer of the coating not only is applied to the "bottom side" (e.g., "passive side") of the die units 412, but (as described herein), a layer of coating also fills the channels such that the periphery of the die units 412 are covered with a layer of coating material. In this manner, the "active side" of the die units 412, being face-down on the carrier plate 410, is not covered with the coating material; rather, only the back/bottom side (e.g., the "passive" side) and the periphery receives a layer of the coating material.

Figure 4F:
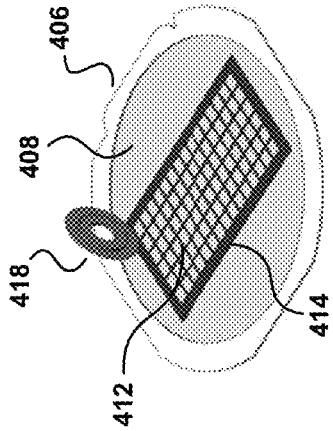
Figure 4E:
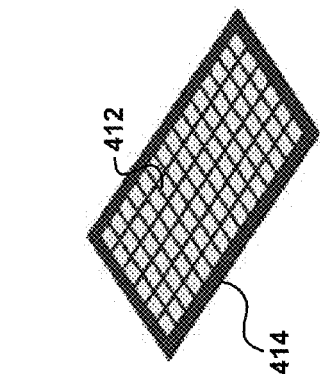
Figure 4D:
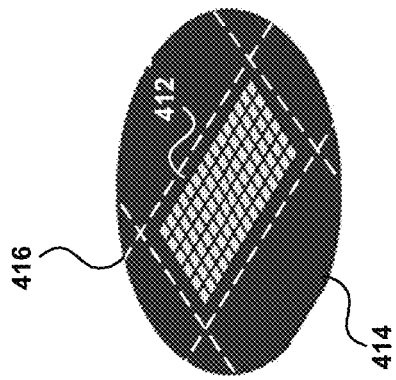

In FIG. 4D, portions of the carrier plate, now combined with the coating 414, are trimmed away 416 in an embodiment. For example, non-essential (e.g., not having die units, not needed for support during further processing, etc.) portions of coated carrier plate 414 are removed (e.g., sliced off) 416. In FIG. 4E, according to an embodiment, the remaining portion of coated carrier plate 414 containing the coated die units 412 is flipped over, such that the "active side" (i.e., the non-coated side) of the die units 412 is facing up, and the coated side is facing down, although either orientation may be utilized for the next step, as discussed herein.

In FIG. 4F, the remaining portion of coated carrier plate 414 containing the face-up die units 412 is placed onto a dicing plate/mount 406, for example on a layer of double-sided adhesive dicing tape 408, although in various embodiments as described earlier, the dicing tape may be applied to the back of the remaining portion of coated carrier plate 414 and then the remaining portion of coated carrier plate 414 containing the die units 412 is placed onto dicing plate/mount 406. A cutting implement 418 dices between the die units 412 (e.g., along the new saw streets between the die units). In an embodiment, this cutting implement has a narrower width than the previous cutting implement 402, which results in channels between the die units 412 having a width narrower than the first channel; for example, a narrower saw blade may be used for the second cutting, or a laser with a narrower width beam, etc., although any approach that results in a narrower cut/channel may be utilized. In an embodiment, these new channels are cut along the reconstituted saw streets created by picking and placing the die units onto the carrier plate 410, and the result of cutting these channels with a narrower tool and/or at a narrower width is that a layer of the coating (e.g., applied via transfer molding as in FIG. 4C) at some thickness is left on the bottom side and the periphery (i.e., the side along the circumference facing outward) of the individual die units after the second cutting and once they are separated (i.e., singulated) from each other, for example by irradiating any UV curable tape holding the individual die units together.

According to an embodiment, the second cutting is performed "from the top"; that is, into the side of the coated carrier plate 414 where the die units are not coated (i.e., the active side). In this way, the saw streets are visible, such that the cutting between the die units may be easily performed. In other embodiments, the coated carrier plate 414 may not be flipped over after applying the coating and trimming away the unwanted portion (e.g., as in FIGS. 4C and 4D), such that the saw streets may not visible once the coated carrier plate 414 is placed onto the new dicing plate/mount 406, as in FIG. 4F. According to an embodiment, the coated carrier plate 414 may have notches, markings, pre-scoring, or other indicators that allow the singulation of the die units by the second cutting implement 418 even though the saw streets may not be visible. For example, notches or markings may be created on the periphery of the coated carrier plate 414 (e.g., as remaining after cutting away portions, such as in FIG. 4D) to guide the cutting implement so that die units are not damaged, and that (in some embodiments) the die units are cut such that a uniform amount of coating layer remains on the periphery of each die unit after singulation.

Figure 5:
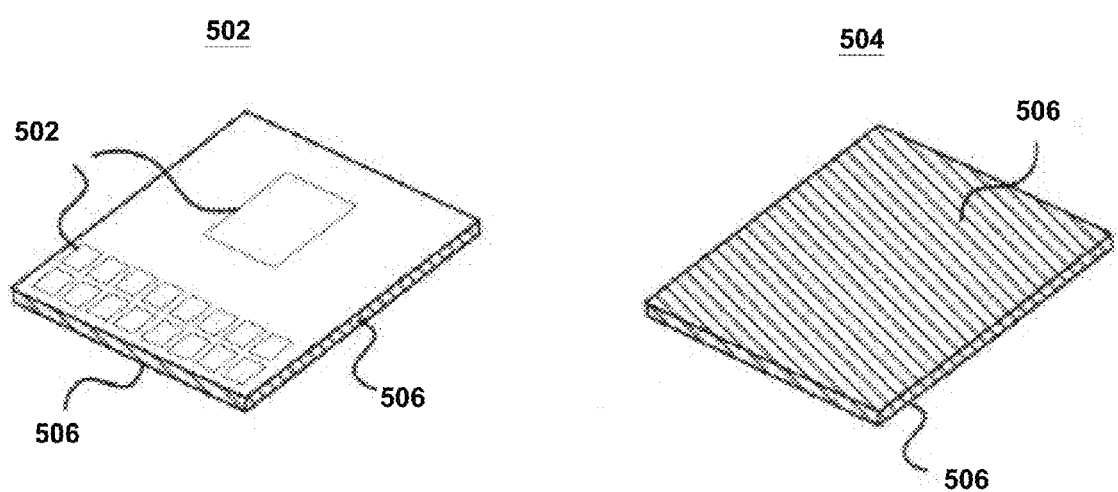
FIG. 5 illustrates top and bottom views of a protected die unit singulated from a silicon substrate, in accordance with various embodiments.

FIG. 5 illustrates top 502 and bottom 504 views of a protected die unit singulated (i.e., separated) from a silicon substrate, in accordance with various embodiments. As discussed herein, a wafer is comprised of individual die units, such as the one illustrated in FIG. 5. These die units have a top 502 and bottom 504 side. The nomenclature herein of "top" and "bottom" or "back" does not indicate a particular orientation of the die, but may indicate which side of the die has the integrated circuits, paths, components and the like 510 disposed thereon. In the example of FIG. 5, the top view 502 of the die shows the circuitry and modules 510, which is not covered by the protective coating that has been applied to the periphery 506 of the die and the bottom or back side 508 of the die, as shown in the bottom view 504 of FIG. 5.

As discussed earlier and further herein, the protective coating 506 is attached (e.g. cured) to the individual die units by cutting channels through the wafer and between the die units, applying the coating to the "bottom side" or "back side" of the wafer (and the die units comprising the wafer), allowing the coating to cover the bottom side 508 of the wafer and seep into the channels, where it covers the periphery 506 of the die unit, much like a frozen river would cover both sides of the riverbank under the surface. The second cutting through the channels described herein, being at a narrower width than the original cutting that created the now-filled channels, leaves a layer of the cured coating attached to the periphery 506 and the bottom (or back) side 508 of the resulting individual, singulated die units. If, for example, the second cutting was made at the same width as the first cutting or wider, then the layer of coating on the bottom (or back) side 508 would be left undisturbed but the coating on the periphery 506 of the die units would either be cut away, lessened to a degree that renders the coating unsuitable for protection, or left unevenly distributed along the periphery.

Figure 6:
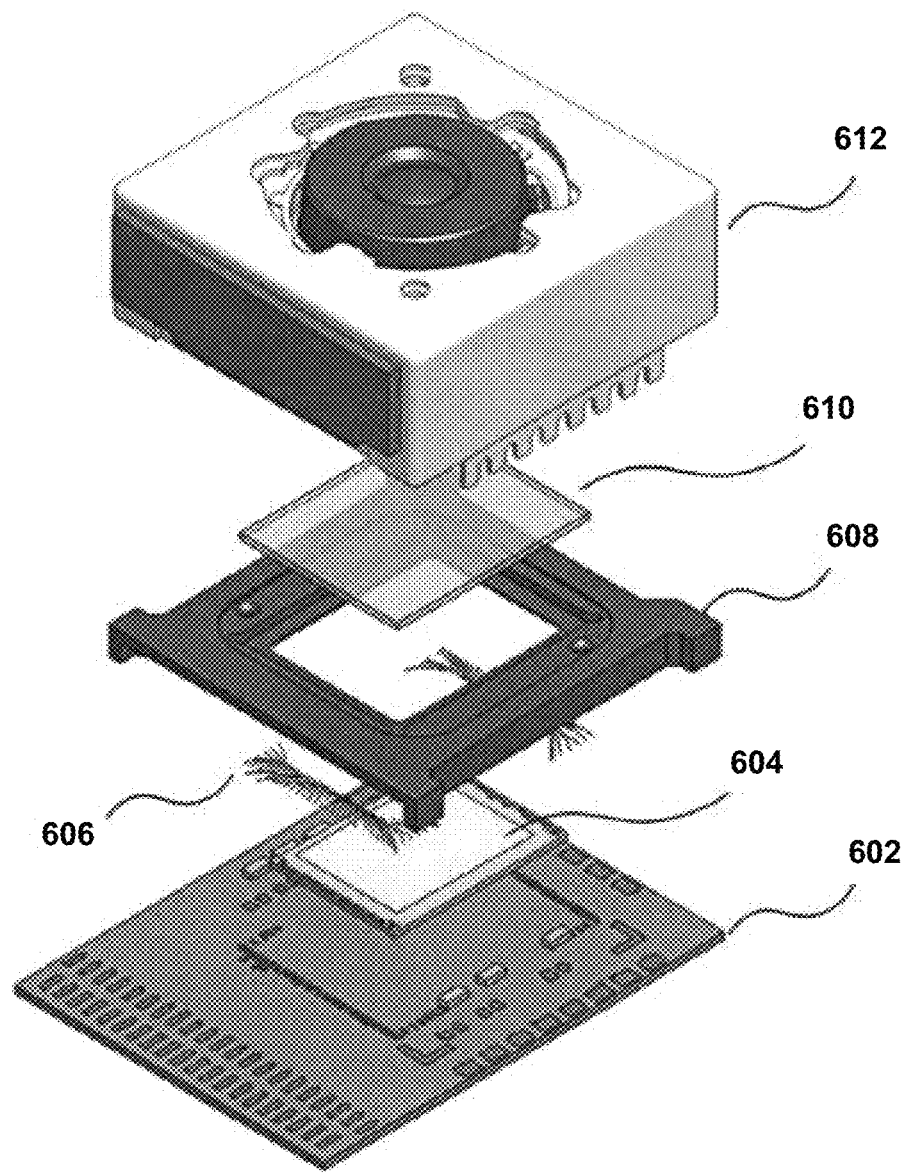
FIG. 6 illustrates an example camera module unit mounted to a silicon substrate formed in accordance with techniques described herein, in accordance with various embodiments.

FIG. 6 illustrates an example camera module unit 600 mounted to a silicon substrate die unit formed in accordance with techniques described herein, in accordance with various embodiments. While a camera module unit is described with regard to FIG. 6, it should be understood that the techniques described herein are not so limited, and may be utilized with various components built on a silicon (or other material) substrate.

Current camera module units have various camera components, such as those illustrated with regard to FIG. 6, mounted on a non-silicon substrate such as FR4, due to the current deficiencies relating to silicon substrate in mobile devices, as discussed earlier. Current approaches take flexible substrates (e.g., FR4) onto which dye, wire bonding, passive components, etc. are attached. Cutting these flexible substrates is generally not done; rather, laser cutting and punching on a tap are example approaches for their manufacture.

Because the camera module is generally part of a mobile device, such as those found in cellphones or consumer- or professional-grade digital cameras, a silicon substrate used in such a device will require some degree of remediation with regard to durability, as discussed earlier. Chips installed into a desktop computer, for example, may be made by standard silicon substrate manufacturing techniques; however, for a mobile device, some degree of stiffening and/or protection of the silicon substrate is advantageous. By remediating the silicon substrate through the techniques described herein, thinner devices may be constructed because of the thinner silicon substrate contributing to a reduction in Z height of devices such as cameras that are internal to the cellphone or other device.

In the example of FIG. 6, the silicon substrate 602 supports passive components such as terminals and opening paths (not labeled) and a sensor die 604, such as a CMOS or CCD sensor that detects and conveys the information that constitutes an image. A wire bond 606 serves to attach the sensor die 604 to the substrate. A blue glass filter 610, in the blue glass holder 608, may operate as an interference filter (e.g., glass absorption filter), such as a plano-plano filter plate in front of the sensor die. A lens component 612, for example containing a voice coil motor (VCM) serving as a lens driver that controls an actuator that moves the lens assembly back and forth to adjust focus and/or magnification. In addition to focusing, some higher-resolution cameras may use lens drivers to position the lens for image stabilization.

Figure 7:
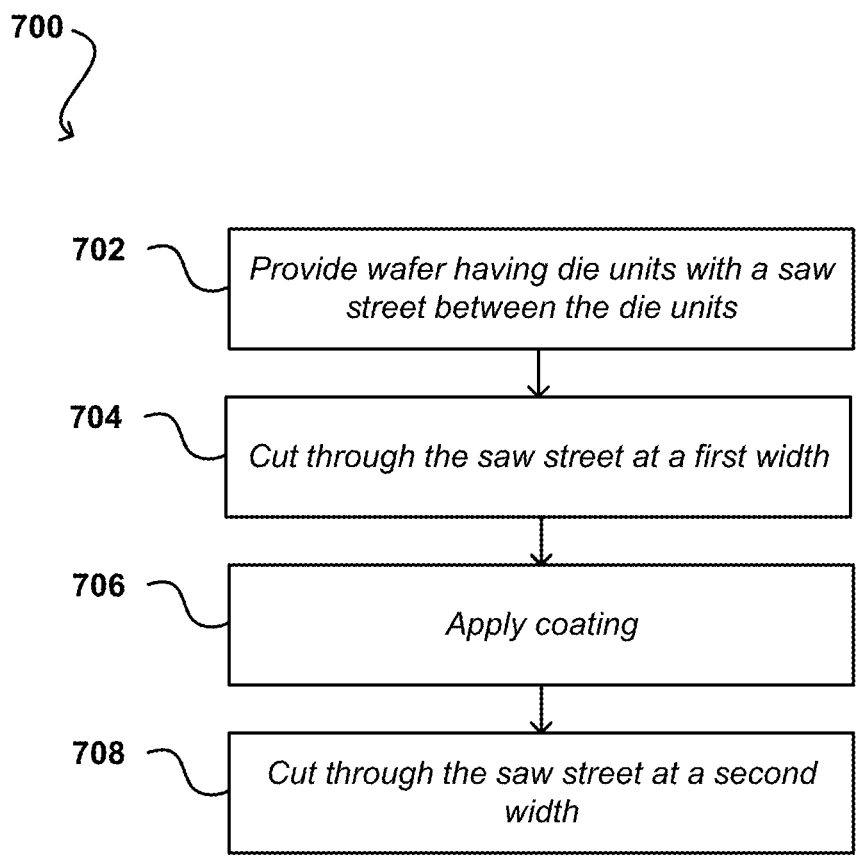
FIG. 7 illustrates an example process for a substrate cutting and coating technique, in accordance with various embodiments.

FIG. 7 illustrates an example process 700 for a substrate cutting and coating technique, in accordance with various embodiments. Although this figure and FIG. 7 may depict functional operations in a particular sequence, the processes are not necessarily limited to the particular order or operations illustrated. One skilled in the art will appreciate that the various operations portrayed in this or other figures can be changed, rearranged, performed in parallel or adapted in various ways. Furthermore, it is to be understood that certain operations or sequences of operations can be added to or omitted from the process, without departing from the scope of the various embodiments. In addition, the process illustrations contained herein are intended to demonstrate an idea of the process flow to one of ordinary skill in the art, rather than specifying the actual sequences of code execution, which may be implemented as different flows or sequences, optimized for performance, or otherwise modified in various ways.

In accordance with various embodiments, a silicon substrate, or wafer, is provided 702 that is made up of a number of die units, as illustrated in FIG. 1. This wafer has a top (or "first") side and a bottom (or "second" side) side. The top side has the integrated circuitry and other components built and disposed thereon, as described earlier. Between the die units is a "saw street," an area of non-functional material that provides spacing between the die units, and along which the wafer is generally cut in order to singulate (i.e., separate) the individual die units. The term "saw street" may refer not only to the area that is designed to be cut, but also to the area after it has been cut (i.e., the "channels").

Channels are cut 704 through the wafer along the saw street. This cutting, and the resultant channels, is at a certain width. For example, the saw blade may be a particular width that results in the channels cut by the saw being at that width, or a laser may be configured to cut at a particular width through the wafer. These channels are cut into the top side of the wafer between the circuitry that comprises each individual die unit, although in an alternate embodiment, the channels may be cut into the bottom side. In an embodiment, the channels are cut completely through the thickness of the wafer, while other embodiments have the cutting being partially through the wafer (i.e., the channels not extending through the wafer to the opposite side of the side initially contacted by the saw blade).

Once the cutting is finished, a coating (e.g., a die attach epoxy adhesive or some other material) is applied 706, generally to the side of the wafer not having the circuitry (i.e., the "bottom" side). As discussed earlier, this coating may be applied in a number of ways known in the art, for example spin coating, stencil printing, and/or transfer molding. The coating covers the bottom side of the wafer (and thereby coats the bottom or back side of the die units), as well as filling the channels that have been cut through the wafer along the saw street; in essence, the saw streets are filled with the coating. Like water in a river, the coating fills the channel so that the sides of the channel (e.g., the riverbank) are completely coated as part of the channel being full. In an embodiment, the coating is cured so that it is "fixed" or "set." The channels may now be thought of as full of coating instead of wafer material.

After the coating is cured, a second cut is made 708 along the saw streets, although this time, the cured coating is being cut through instead of substrate. This second cutting is performed at a particular width than is narrower than the width at which the initial cut was made. For example, a saw blade of narrower width may be used for the second cut than was used for the initial cut. As a result of this second cut, the individual die units may be singulated (i.e., separated) from each other, because the cut is made through the cured coating at the entire depth of the wafer (i.e., cut through completely). After this second cut, the individual die units can be separated from each other so that they may be packaged or otherwise utilized as described earlier. The individual die units will therefore have a cured layer of the coating on their back side (i.e., the side without the integrated circuitry, etched paths, etc.) and on their periphery, which is the 4 sides (in the embodiment of a square or rectangular die) facing outward along their circumference.

Figure 8:
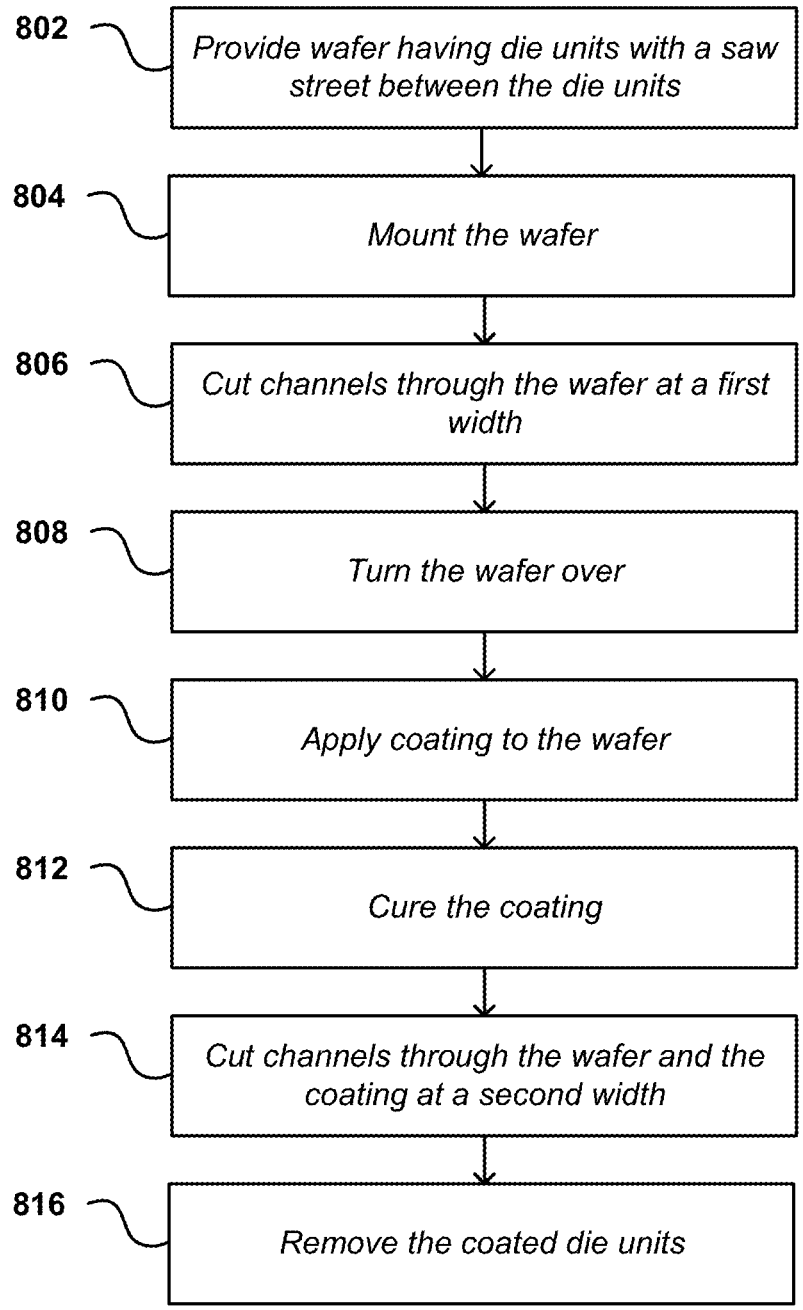
FIG. 8 illustrates an example process for a substrate cutting and coating technique, in accordance with various embodiments.

FIG. 8 illustrates another example process 800 for a substrate cutting and coating technique, in accordance with various embodiments. In an embodiment, a silicon substrate that comprises a plurality of die units is provided 802. The die units are separated by a saw street, and the die units (and by extension, the wafer) have a top and bottom side, wherein in an embodiment the top side has circuitry, etched paths, and other components disposed thereon, although in other embodiments, both sides may have components built on them.

The wafer is mounted 804, or placed onto a component such as a dicing plate, which in an embodiment may be a ring of material designed to support and hold the wafer during the dicing process. In an embodiment, a covering such as UV curable dicing tape is attached to one or both sides of the wafer. For example, dicing tape may be attached to the bottom side of the wafer and also to the dicing plate, resulting in the wafer being held securely onto the dicing plate during the dicing procedure, and the individual die units being held together once the dicing is finished. In the case of UV curable dicing tape, the tape will hold fast until irradiated by ultraviolet light. Other types of tape and removal techniques may be utilized, separately or in concert with UV curable tape.

Once the wafer is mounted and secured, channels are cut 806 through the top side of the wafer, for example by a dicing saw, laser, or other implement. These channels may be cut entirely through the depth of the wafer, or partially. The channels are cut at a first width along the saw streets between the die units. In an embodiment wherein dicing tape or other coverings are attached to the top and/or bottom side of the wafer, the cutting may extend through one or both coverings, as the case may be. In various embodiments, a spin coating or other coating technique may be used on one or both sides of the wafer after the initial cut, as described herein.

After the initial cut into the top of the wafer, the wafer is flipped 808 or otherwise turned over. In an embodiment, the cutting implements may be repositioned around the wafer instead of physically turning the wafer over. The wafer may be turned onto a new wafer mount (e.g., dicing plate), which may have dicing tape or other material attached to it. In an embodiment, the dicing tape is applied to the top side of the wafer (i.e., the side that was just cut into), for example to secure the top side to the wafer mount after flipping it over, as well as to keep the die units together and sitting in the same location in the case of dicing tape on the bottom side of the wafer having been cut through. According to traditional die building and dicing techniques, once the dies are diced, then they are extracted and packaged or otherwise used; however, the techniques described herein have additional steps.

After the wafer is turned over, or equipment is repositioned so that the bottom side of the wafer is being manipulated as described herein, a coating is applied 810 to the bottom side of the wafer (i.e., the side that was not cut into initially by the cutting implement and that does not have the circuitry, etched paths, etc., although in various embodiments, one or both sides may have such components). In an alternate embodiment, the coating is applied to the same side of the wafer that was cut into. As discussed herein, the coating may be applied using any number of various techniques known in the art, such as spin coating, stencil printing, and/or transfer molding. According to an embodiment, the coating covers the entire side of the wafer to which it is being applied, as well as substantially filling the channels left by the cutting procedure above. The coating is then cured 812 or otherwise fixed in place, for example permanently.

After the coating is cured, a second cut is made 814. According to an embodiment, this cut is made along the saw streets, and by extension the channels left by the first cut, through the cured coating. This cut is made at a narrower width; for example, using a thinner saw blade, or configuring a laser to cut at a narrower width than at which the first cut was performed. This cut may be made into the bottom side of the wafer (i.e., the side facing up in the wafer mount after the flipping, or the side without circuitry, etching, etc.), and goes completely through the depth of the wafer (e.g., the channels full of cured coating) and in an embodiment, any dicing tape that may be attached to one or both sides of the wafer.

After the second cutting at the narrower width, the individual die units may be extracted or otherwise removed 816. For example, if the die units are being held together or otherwise attached to UV curable dicing tape, then the wafer may be irradiated with UV light in order to release the UV curable tape. Once the die units are removed, they have a layer of the coating material on one side (e.g., the bottom or back side), as well as on the periphery of the chip (i.e., the side facing outward along the circumference). This protective coating offers the advantages to silicon substrates in mobile devices described earlier.

According to various embodiments, a laser or other implement may be used for the cutting. For example, a saw may be used for the initial cut, and a laser used for the finishing cut, or vice versa. In an embodiment, the corners of the square or rectangular die units may be rounded, for example by a laser, while maintaining a substantial covering of the layer of protective coating on the periphery.

Figure 9:
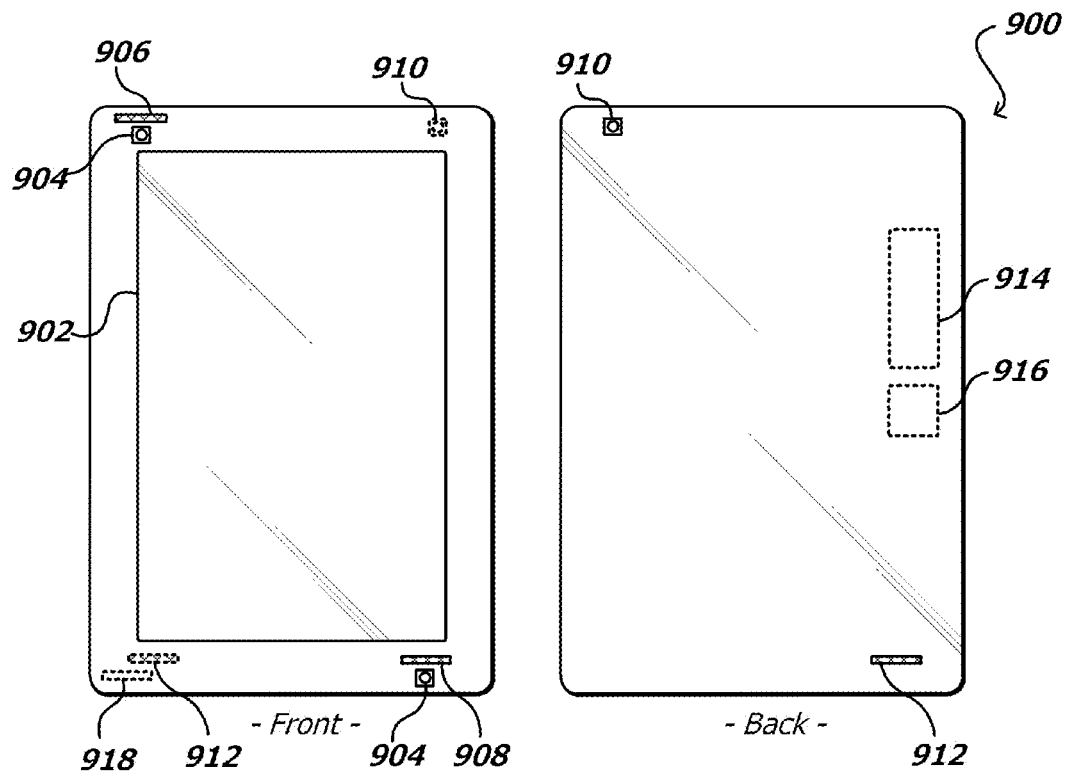
FIG. 9 illustrates front and back views of an example portable computing device that can be used in accordance with various embodiments.

FIG. 9 illustrates front and back views of an example electronic computing device 900 that can be used in accordance with various embodiments, for example, a mobile device using a camera or other component that uses a silicon substrate formed using the techniques described herein, or as part of a controller or control unit configured to control machinery and/or components to coat and dice a wafer using the techniques described herein. Although a portable computing device (e.g., a smartphone, an electronic book reader, or tablet computer) is shown, it should be understood that any device capable of receiving and processing input can be used in accordance with various embodiments discussed herein. The devices can include, for example, desktop computers, notebook computers, electronic book readers, personal data assistants, cellular phones, video gaming consoles or controllers, television set top boxes, and portable media players, among others.

In this example, the computing device 900 has a display screen 902 (e.g., an LCD element) operable to display information or image content to one or more users or viewers of the device. The display screen of some embodiments displays information to the viewers facing the display screen (e.g., on the same side of the computing device as the display screen). The computing device in this example can include one or more imaging elements, in this example including two image capture elements 904 on the front of the device and at least one image capture element 910 on the back of the device. It should be understood, however, that image capture elements could also, or alternatively, be placed on the sides or corners of the device, and that there can be any appropriate number of capture elements of similar or different types. Each image capture element 904 and 910 may be, for example, a camera, a charge-coupled device (CCD), a motion detection sensor or an infrared sensor, or other image capturing technology.

As discussed, the device can use the images (e.g., still or video) captured from the imaging elements 904 and 910 to generate a three-dimensional simulation of the surrounding environment (e.g., a virtual reality of the surrounding environment for display on the display element of the device). Further, the device can utilize outputs from at least one of the image capture elements 904 and 910 to assist in determining the location and/or orientation of a user and in recognizing nearby persons, objects, or locations. For example, if the user is holding the device, the captured image information can be analyzed (e.g., using mapping information about a particular area) to determine the approximate location and/or orientation of the user. The captured image information may also be analyzed to recognize nearby persons, objects, or locations (e.g., by matching parameters or elements from the mapping information).

The computing device can also include at least one microphone or other audio capture elements capable of capturing audio data, such as words spoken by a user of the device, music being hummed by a person near the device, or audio being generated by a nearby speaker or other such component, although audio elements are not required in at least some devices. In this example there are three microphones, one microphone 908 on the front side, one microphone 912 on the back, and one microphone 906 on or near a top or side of the device. In some devices there may be only one microphone, while in other devices there might be at least one microphone on each side and/or corner of the device, or in other appropriate locations.

The device 900 in this example also includes one or more orientation- or position-determining elements 918 operable to provide information such as a position, direction, motion, or orientation of the device. These elements can include, for example, accelerometers, inertial sensors, electronic gyroscopes, and electronic compasses.

The example device also includes at least one communication mechanism 914, such as may include at least one wired or wireless component operable to communicate with one or more electronic devices. The device also includes a power system 916, such as may include a battery operable to be recharged through conventional plug-in approaches, or through other approaches such as capacitive charging through proximity with a power mat or other such device. Various other elements and/or combinations are possible as well within the scope of various embodiments.

Figure 10:
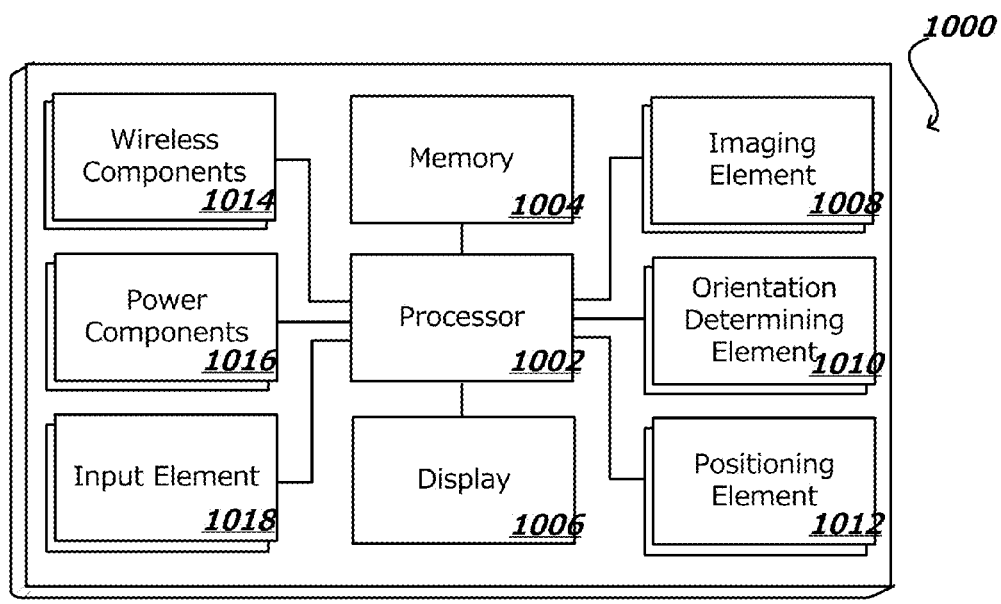
FIG. 10 illustrates an example set of basic components of a portable computing device, such as the device described with respect to FIG. 9.

FIG. 10 illustrates a set of basic components of an electronic computing device 1000 such as the device 900 described with respect to FIG. 9. In this example, the device includes at least one processing unit 1002 for executing instructions that can be stored in a memory device or element 1004. As would be apparent to one of ordinary skill in the art, the device can include many types of memory, data storage, or computer-readable media, such as a first data storage for program instructions for execution by the processing unit(s) 1002, the same or separate storage can be used for images or data, a removable memory can be available for sharing information with other devices, and any number of communication approaches can be available for sharing with other devices.

The device typically will include some type of display element 1006, such as a touch screen, electronic ink (e-ink), organic light emitting diode (OLED) or liquid crystal display (LCD), although devices such as portable media players might convey information via other means, such as through audio speakers.

As discussed, the device in many embodiments will include at least one imaging element 1008, such as one or more cameras that are able to capture images of the surrounding environment and that are able to image a user, people, or objects in the vicinity of the device. The image capture element can include any appropriate technology, such as a CCD image capture element having a sufficient resolution, focal range, and viewable area to capture an image of the user when the user is operating the device. Methods for capturing images using a camera element with a computing device are well known in the art and will not be discussed herein in detail. It should be understood that image capture can be performed using a single image, multiple images, periodic imaging, continuous image capturing, image streaming, etc. Further, a device can include the ability to start and/or stop image capture, such as when receiving a command from a user, application, or other device.

The example computing device 1000 also includes at least one orientation determining element 1010 able to determine and/or detect orientation and/or movement of the device. Such an element can include, for example, an accelerometer or gyroscope operable to detect movement (e.g., rotational movement, angular displacement, tilt, position, orientation, motion along a non-linear path, etc.) of the device 1000. An orientation determining element can also include an electronic or digital compass, which can indicate a direction (e.g., north or south) in which the device is determined to be pointing (e.g., with respect to a primary axis or other such aspect).

As discussed, the device in many embodiments will include at least a positioning element 1012 for determining a location of the device (or the user of the device). A positioning element can include or comprise a GPS or similar location-determining elements operable to determine relative coordinates for a position of the device. As mentioned above, positioning elements may include wireless access points, base stations, etc., that may either broadcast location information or enable triangulation of signals to determine the location of the device. Other positioning elements may include QR codes, barcodes, RFID tags, NFC tags, etc. that enable the device to detect and receive location information or identifiers that enable the device to obtain the location information (e.g., by mapping the identifiers to a corresponding location). Various embodiments can include one or more such elements in any appropriate combination.

As mentioned above, some embodiments use the element(s) to track the location of a device. Upon determining an initial position of a device (e.g., using GPS), the device of some embodiments may keep track of the location of the device by using the element(s), or in some instances, by using the orientation determining element(s) as mentioned above, or a combination thereof. As should be understood, the algorithms or mechanisms used for determining a position and/or orientation can depend at least in part upon the selection of elements available to the device.

The example device also includes one or more wireless components 1014 operable to communicate with one or more electronic devices within a communication range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections as known in the art.

The device also includes a power system 1016, such as may include a battery operable to be recharged through conventional plug-in approaches, or through other approaches such as capacitive charging through proximity with a power mat or other such device. Various other elements and/or combinations are possible as well within the scope of various embodiments.

In some embodiments the device can include at least one additional input device 1018 able to receive conventional input from a user. This conventional input can include, for example, a push button, touch pad, touch screen, wheel, joystick, keyboard, mouse, keypad, or any other such device or element whereby a user can input a command to the device. These I/O devices could even be connected by a wireless infrared or Bluetooth or other link as well in some embodiments. Some devices also can include a microphone or other audio capture element that accepts voice or other audio commands. For example, a device might not include any buttons at all, but might be controlled only through a combination of visual and audio commands, such that a user can control the device without having to be in contact with the device.

In some embodiments, a device can include the ability to activate and/or deactivate detection and/or command modes, such as when receiving a command from a user or an application, or retrying to determine an audio input or video input, etc. In some embodiments, a device can include an infrared detector or motion sensor, for example, which can be used to activate one or more detection modes. For example, a device might not attempt to detect or communicate with devices when there is not a user in the room. If an infrared detector (i.e., a detector with one-pixel resolution that detects changes in state) detects a user entering the room, for example, the device can activate a detection or control mode such that the device can be ready when needed by the user, but conserve power and resources when a user is not nearby.

A computing device, in accordance with various embodiments, may include a light-detecting element that is able to determine whether the device is exposed to ambient light or is in relative or complete darkness. Such an element can be beneficial in a number of ways. In certain conventional devices, a light-detecting element is used to determine when a user is holding a cell phone up to the user's face (causing the light-detecting element to be substantially shielded from the ambient light), which can trigger an action such as the display element of the phone to temporarily shut off (since the user cannot see the display element while holding the device to the user's ear). The light-detecting element could be used in conjunction with information from other elements to adjust the functionality of the device. For example, if the device is unable to detect a user's view location and a user is not holding the device but the device is exposed to ambient light, the device might determine that it has likely been set down by the user and might turn off the display element and disable certain functionality. If the device is unable to detect a user's view location, a user is not holding the device and the device is further not exposed to ambient light, the device might determine that the device has been placed in a bag or other compartment that is likely inaccessible to the user and thus might turn off or disable additional features that might otherwise have been available. In some embodiments, a user must either be looking at the device, holding the device or have the device out in the light in order to activate certain functionality of the device. In other embodiments, the device may include a display element that can operate in different modes, such as reflective (for bright situations) and emissive (for dark situations). Based on the detected light, the device may change modes.

Using the microphone, the device can disable other features for reasons substantially unrelated to power savings. For example, the device can use voice recognition to determine people near the device, such as children, and can disable or enable features, such as Internet access or parental controls, based thereon. Further, the device can analyze recorded noise to attempt to determine an environment, such as whether the device is in a car or on a plane, and that determination can help to decide which features to enable/disable or which actions are taken based upon other inputs. If voice recognition is used, words can be used as input, either directly spoken to the device or indirectly as picked up through conversation. For example, if the device determines that it is in a car, facing the user and detects a word such as "hungry" or "eat," then the device might turn on the display element and display information for nearby restaurants, etc. A user can have the option of turning off voice recording and conversation monitoring for privacy and other such purposes.

In some of the above examples, the actions taken by the device relate to deactivating certain functionality for purposes of reducing power consumption. It should be understood, however, that actions can correspond to other functions that can adjust similar and other potential issues with use of the device. For example, certain functions, such as requesting Web page content, searching for content on a hard drive and opening various applications, can take a certain amount of time to complete. For devices with limited resources, or that have heavy usage, a number of such operations occurring at the same time can cause the device to slow down or even lock up, which can lead to inefficiencies, degrade the user experience and potentially use more power.

In order to address at least some of these and other such issues, approaches in accordance with various embodiments can also utilize information such as user gaze direction to activate resources that are likely to be used in order to spread out the need for processing capacity, memory space and other such resources.

In some embodiments, the device can have sufficient processing capability, and the imaging element and associated analytical algorithm(s) may be sensitive enough to distinguish between the motion of the device, motion of a user's head, motion of the user's eyes and other such motions, based on the captured images alone. In other embodiments, such as where it may be desirable for the process to utilize a fairly simple imaging element and analysis approach, it can be desirable to include at least one orientation determining element that is able to determine a current orientation of the device. In one example, the at least one orientation determining element is at least one single- or multi-axis accelerometer that is able to detect factors such as three-dimensional position of the device and the magnitude and direction of movement of the device, as well as vibration, shock, etc. Methods for using elements such as accelerometers to determine orientation or movement of a device are also known in the art and will not be discussed herein in detail. Other elements for detecting orientation and/or movement can be used as well within the scope of various embodiments for use as the orientation determining element. When the input from an accelerometer or similar element is used along with the input from the camera, the relative movement can be more accurately interpreted, allowing for a more precise input and/or a less complex image analysis algorithm.

When using an imaging element of the computing device to detect motion of the device and/or user, for example, the computing device can use the background in the images to determine movement. For example, if a user holds the device at a fixed orientation (e.g. distance, angle, etc.) to the user and the user changes orientation to the surrounding environment, analyzing an image of the user alone will not result in detecting a change in an orientation of the device. Rather, in some embodiments, the computing device can still detect movement of the device by recognizing the changes in the background imagery behind the user. So, for example, if an object (e.g., a window, picture, tree, bush, building, car, etc.) moves to the left or right in the image, the device can determine that the device has changed orientation, even though the orientation of the device with respect to the user has not changed. In other embodiments, the device may detect that the user has moved with respect to the device and adjust accordingly. For example, if the user tilts their head to the left or right with respect to the device, the content rendered on the display element may likewise tilt to keep the content in orientation with the user.

Figure 11:
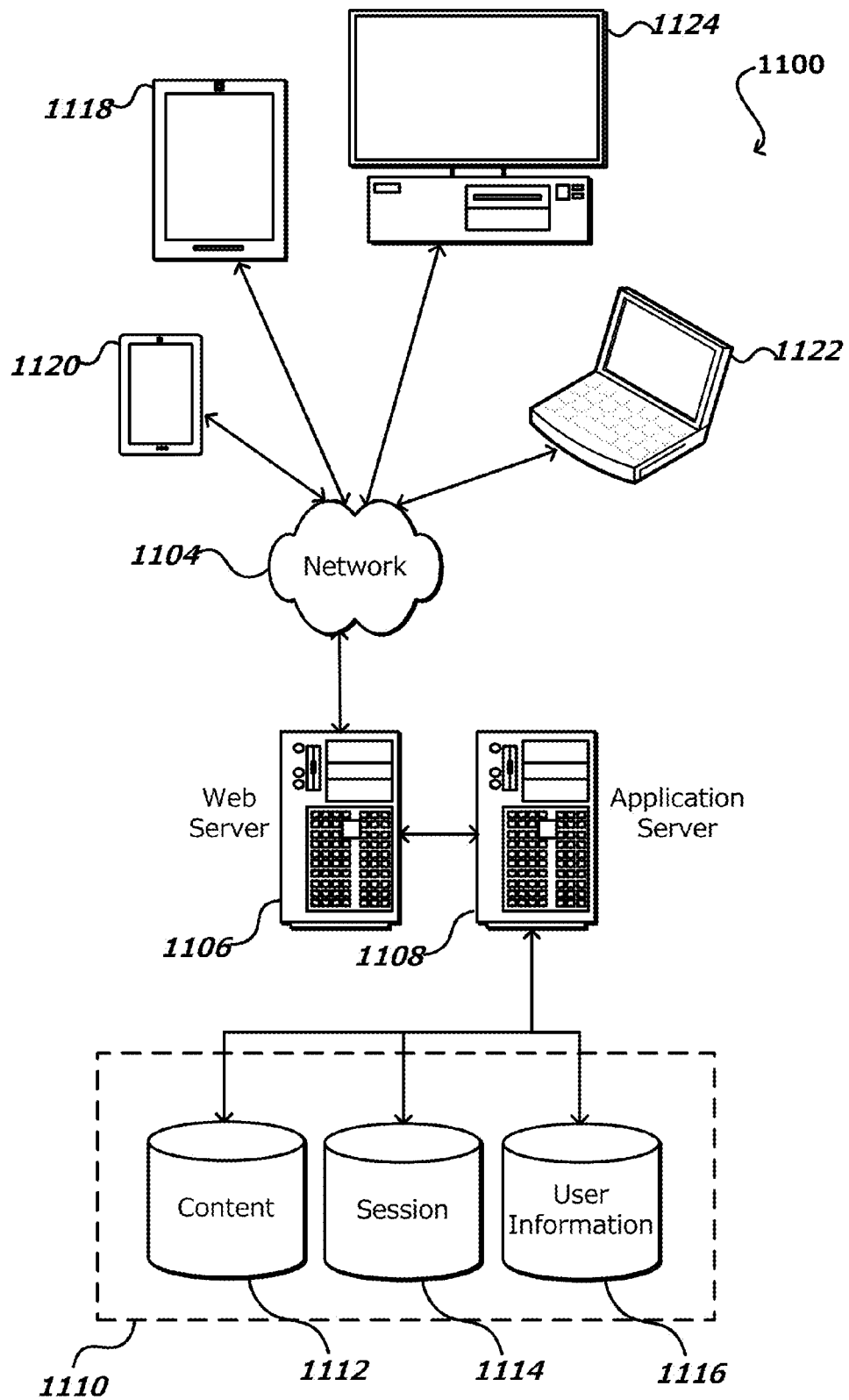
FIG. 11 illustrates an example of an environment for implementing aspects in accordance with various embodiments.

As discussed, different approaches can be implemented in various environments in accordance with the described embodiments. For example, FIG. 11 illustrates an example of an environment 1100 for implementing aspects in accordance with various embodiments. As will be appreciated, although a Web-based environment is used for purposes of explanation, different environments may be used, as appropriate, to implement various embodiments. The system includes electronic client devices 1118, 1120, 1122, and 1124, which can include any appropriate device operable to send and receive requests, messages or information over an appropriate network 1104 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. The network could be a "push" network, a "pull" network, or a combination thereof. In a "push" network, one or more of the servers push out data to the client device. In a "pull" network, one or more of the servers send data to the client device upon request for the data by the client device. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server 1106 for receiving requests and serving content in response thereto, although for other networks, an alternative device serving a similar purpose could be used, as would be apparent to one of ordinary skill in the art.

The illustrative environment includes at least one application server 1108 and a data store 1110. It should be understood that there can be several application servers, layers or other elements, processes or components, which may be chained or otherwise configured, which can interact to perform tasks such as obtaining data from an appropriate data store. As used herein, the term "data store" refers to any device or combination of devices capable of storing, accessing and retrieving data, which may include any combination and number of data servers, databases, data storage devices and data storage media, in any standard, distributed or clustered environment. The application server 1108 can include any appropriate hardware and software for integrating with the data store 1110 as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server 1106 in the form of HTML, XML or another appropriate structured language in this example. The handling of all requests and responses, as well as the delivery of content between the client devices 1118, 1120, 1122, and 1124 and the application server 1108, can be handled by the Web server 1106. It should be understood that the Web and application servers are not required and are merely example components, as structured code discussed herein can be executed on any appropriate device or host machine as discussed elsewhere herein.

The data store 1110 can include several separate data tables, databases or other data storage mechanisms and media for storing data relating to a particular aspect. For example, the data store illustrated includes mechanisms for storing content (e.g., production data) 1112 and user information 1116, which can be used to serve content for the production side. The data store is also shown to include a mechanism for storing log or session data 1114. It should be understood that there can be many other aspects that may need to be stored in the data store, such as page image information and access rights information, which can be stored in any of the above listed mechanisms as appropriate or in additional mechanisms in the data store 1110. The data store 1110 is operable, through logic associated therewith, to receive instructions from the application server 1108 and obtain, update or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on anyone of the user devices 1118, 1120, 1122 and 1124. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 11. Thus, the depiction of the system 1100 in FIG. 11 should be taken as being illustrative in nature and not limiting to the scope of the disclosure.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, OSI, FTP, UPnP, NFS, CIFS and AppleTalk. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Various systems, devices, methods, and approaches described herein may be implemented on one or more general-purpose and/or specific computing devices, such as under the control of one or more computer systems configured with executable instructions, the computer systems for example having one or more processors which may be communicatively coupled to other components such as one or more memory units that may store the instructions for execution. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for fabricating a silicon wafer, the method comprising:
    providing a silicon wafer comprising a plurality of die units, each die unit of the plurality of die units having an active side and a passive side, the active side having circuitry disposed thereon, and a saw street between each of the die units, the silicon wafer having a top side and a bottom side opposing the top side, the top side having circuitry disposed thereon and the bottom side having a first UV curable dicing tape disposed thereon;
    mounting the silicon wafer onto a dicing plate such that the bottom side is in contact with the dicing plate;
    forming, in the top side of the silicon wafer along the saw street, a first plurality of channels using a first blade, the first blade having a first width;
    turning the die units over so that the active side of each of the die units is in contact with the dicing plate and second UV curable dicing tape;
    irradiating the first UV curable dicing tape with ultraviolet light;
    applying a layer of an epoxy adhesive to the passive side of each of the die units, the layer of the epoxy adhesive substantially covering the passive side of each of the die units and substantially filling the first plurality of channels;
    curing the epoxy adhesive;
    cutting with a second blade to completely separate the die units from each other, the second blade having a second width smaller than the first width;
    irradiating the second UV curable dicing tape with ultraviolet light; and
    extracting the die units,
    wherein each of the die units has a portion of the layer of the epoxy adhesive on a back side and a periphery of the die unit.

2. The method of claim 1, wherein the cutting using the second blade is into the bottom side of the silicon wafer along the saw street, the method further comprising:
    creating markings along a periphery of the silicon wafer, the markings being aligned with the saw streets between the die units.

3. The method of claim 1, wherein turning the die units over further comprises:
    singulating the die units;
    attaching the second UV curable dicing tape to a carrier plate; and
    placing the die units in an arrangement onto the second UV curable dicing tape attached to the carrier plate, such that the active side of each of the die units is in contact with the second UV curable dicing tape attached to the carrier plate.

4. The method of claim 3, wherein the layer of adhesive is applied to the die units on the carrier plate, the method further comprising:
    irradiating the second UV curable dicing tape attached to the carrier plate to separate the die units from the carrier plate.

5. A method, comprising:
    providing a substrate comprising a plurality of die units, the substrate having a first side and a second side opposing the first side;
    attaching first UV curable dicing tape to the second side of the substrate;
    forming, into the first side of the substrate, first channels through the substrate, the first channels having a first width, and being along a saw street between the die units;
    irradiating the first UV curable dicing tape with ultraviolet light;
    attaching second UV curable dicing tape to the first side of the substrate;
    applying a coating to the second side of the substrate, the coating substantially filling the channels;
    cutting second channels through the coating, so that the die units are separated from each other and each die unit has a layer of the coating on a back side and a periphery of the die unit, the second channels having a second width narrower than the first width and being along the saw street; and
    irradiating the second UV curable dicing tape with ultraviolet light.

6. The method of claim 5, wherein the first UV curable dicing tape is attached to the second side of the substrate prior to forming the first channels, and wherein the second UV curable dicing tape is attached to the first side of the substrate prior to cutting the second channels.

7. The method of claim 5, the method further comprising:
mounting the second side of the substrate to a dicing plate; and
after forming the channels having the first width, turning the substrate over so that the first side of the substrate is contacting the dicing plate.

8. The method of claim 5, further comprising:
mounting a camera module unit onto one of the die units.

9. The method of claim 5, further comprising:
prior to applying the coating to the second side of the substrate,
singulating the die units, each die unit having an active side and a passive side, the active side having circuitry disposed thereon and the passive side comprising a portion of substrate;
attaching the second UV curable dicing tape to a carrier plate; and
placing the active side of each of the die units onto the second UV curable dicing tape attached to the carrier plate,
wherein the die units are placed in an arrangement on the second UV curable dicing tape to generate an arrangement of die units having saw streets in the coating between the die units in the arrangement.

10. The method of claim 9, wherein the coating is applied to the die units on the carrier plate, and further comprising:
trimming, after applying the coating, the carrier plate such that non-essential portions of the carrier plate are removed; and
placing, after the trimming, the carrier plate having the arrangement of die units onto a dicing plate such that the active side of the die units is facing up.

11. The method of claim 9, further comprising:
irradiating the second UV curable dicing tape such that the active side of each of the die units is separated from the carrier plate, the active side of each of the die units free of the coating.

12. The method of claim 5, further comprising:
curing the coating prior to cutting through the coating, wherein the coating is applied using one of spin coating, stencil printing, or transfer molding.

13. The method of claim 5, further comprising:
forming rounded corners on the periphery of the die units, wherein the rounded corners are substantially covered with the coating,
wherein at least one of the cutting through the coating or the forming rounded corners is performed by a laser.

14. The method of claim 5, wherein a depth of the channels is less than a thickness of the substrate.

15. A system for singulating a substrate comprising a plurality of die units, comprising:
a dicing frame onto which the substrate is mounted;
a first cutting implement configured to cut channels having a first width into the substrate;
a second cutting implement configured to cut channels having a second width into the substrate, the second width being narrower than the first width;
a coating application device configured to dispense a layer of coating material onto the substrate; and
a controller configured to:
cause the first cutting implement to cut along a saw street between the die units on the substrate, the substrate having a first side and a second side, wherein the first side is opposite the second side;
cause first UV curable dicing tape to be applied to the second side of the substrate;
cause the first UV curable dicing tape to be irradiated with ultraviolet light;
cause second UV curable dicing tape to be applied to the first side of the substrate;
cause the coating application device to dispense the coating material on the second side of the substrate, such that the coating material substantially covers the second side of the substrate and substantially fills the saw street between the die units;
cause the second cutting implement to cut along the saw street, such that the die units are singulated, each of the die units having a layer of the coating material on a back side and a periphery of the die unit; and
cause the second UV curable dicing tape to be irradiated with ultraviolet light.

16. The system of claim 15, wherein the coating material is dispensed using one of spin coating, stencil printing, or transfer molding.

17. The system of claim 15, wherein the first cutting implement comprises a saw and the second cutting implement comprises a laser.

18. The system of claim 15, wherein the controller is further configured to:
cause the second side of the substrate to be placed onto the dicing frame;
cause the substrate to be turned over so that the first side of the substrate is placed onto the dicing frame after the first cutting implement has cut the substrate and before the coating material has been applied to the second side of the substrate.

19. The system of claim 15, wherein the controller is further configured to:
prior to causing the coating application device to dispense the coating material,
singulate the die units, each die unit having an active side and a passive side;
attach the second UV curable dicing tape to a carrier plate; and
place the active side of the die units onto the second UV curable dicing tape attached to the carrier plate.

20. The system of claim 19, wherein the controller is further configured to:
cause the second UV curable dicing tape to be irradiated with ultraviolet light such that the active side of each of the die units is separated from the carrier plate, the active side of each of the die units being free of the coating material.

* * * * *